(12) United States Patent
Blanchard

(10) Patent No.: US 7,411,249 B1
(45) Date of Patent: Aug. 12, 2008

(54) LATERAL HIGH-VOLTAGE TRANSISTOR WITH VERTICALLY-EXTENDED VOLTAGE-EQUALIZED DRIFT REGION

(76) Inventor: Richard A. Blanchard, 10724 Mora Dr., Los Altos, CA (US) 94024-6530

( * ) Notice: Subject to any disclaimer, the term of this patent is extended or adjusted under 35 U.S.C. 154(b) by 172 days.

(21) Appl. No.: 11/272,437

(22) Filed: Nov. 9, 2005

Related U.S. Application Data

(60) Provisional application No. 60/626,394, filed on Nov. 9, 2004.

(51) Int. Cl.
*H01L 29/76* (2006.01)

(52) U.S. Cl. .................. 257/342; 257/341; 257/343

(58) Field of Classification Search ......... 257/339–343, 257/E29.256
See application file for complete search history.

(56) References Cited

U.S. PATENT DOCUMENTS

| 6,534,823 B2 * | 3/2003 | Hueting et al. ............... 257/330 |
| 2004/0232486 A1 * | 11/2004 | Disney et al. ................ 257/342 |

* cited by examiner

*Primary Examiner*—Zandra Smith
*Assistant Examiner*—Paul E Patton
(74) *Attorney, Agent, or Firm*—Groover & Associates

(57) ABSTRACT

A lateral high-voltage device in which conductive trench plates are inserted across the voltage-withstand region, so that, in the on state, the current density vectors have less convergence. This can help reduce on-resistance.

7 Claims, 11 Drawing Sheets

LATERAL HIGH-VOLTAGE TRANSISTOR WITH VERTICALLY-EXTENDED VOLTAGE-EQUALIZED DRIFT REGION

CROSS-REFERENCE TO RELATED APPLICATIONS

This application claims priority from U.S. provisional patent application Ser. No. 60/626,394 filed on Nov. 9, 2004, which is hereby incorporated by reference.

BACKGROUND AND SUMMARY OF THE INVENTIONS

The present application relates to semiconductor devices, and more particularly to lateral devices which are capable of switching relatively high voltages, e.g. of 50V or more.

Many power devices are designed as vertical devices, where the direction of carrier flow is into the semiconductor material (normal to the surface of the wafer). However, there are many advantages to "lateral" power devices, i.e. to transistors which have their direction of carrier flow approximately parallel to the surface. One outstanding attraction of lateral devices is process compatibility, since lateral devices can usually be fabricated with process steps which are the similar to or at least compatible with those used for low-voltage devices. Another attraction is that lateral devices tend to be somewhat easier to integrate with low-voltage devices, to provide "smart power" or "integrated power" functionality.

A MOS-gated transistor referred to as an "oxide-bypassed" VDMOS transistor has been proposed for minimizing the specific on-resistance of devices. See Liang et al., "Oxide-Bypassed VDMOS (OBVDMOS): An Alternative to Super-junction High Voltage MOS Power Devices, 22 IEEE Electron Device Letters No. 8, August 2001, which is hereby incorporated by reference.

The structure shown in FIG. 1 was originally proposed, but several variations of this structure have been suggested. See e.g. Liang et al., "Tunable Oxide-Bypassed VDMOS (OB-VDMOS): Breaking the Silicon Limit for the Second Generation", ISPSD 2002; and Yang et al., "Tunable Oxide-Bypassed Trench Gate MOSFET: Breaking the Ideal Superjunction MOSFET Performance Line at Equal Column Width", 24 IEEE Electron Device Letters No. 11, November 2003; both of which are hereby incorporated by reference. In the OBVDMOS device shown in FIG. 1, the thick oxide 102 is capable of sustaining the high source-to-drain voltage (between source 120 and drain 130), while the buried pillars 110 of N+ or P+ polysilicon that are located on both sides of the voltage-withstand region 140 help to deplete the voltage-withstand region 140 of n-type carriers when there is a drain-to-source voltage present. For a specific voltage-withstand region width and doping concentration, the thickness of the oxide layer 102 between the N+ or P+ polysilicon 110 and the voltage-withstand region 140 can be selected to deplete the entire voltage-withstand region 140 at peak reverse bias.

Lateral High-Voltage Transistor With Vertically-Extended Voltage-Equalized Drift Region The disclosed innovations, in various embodiments, provide one or more of at least the following advantages:

Process compatibility;

Improved on-resistance; and/or

Compatibility with high-voltage diodes and resistors.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 3A shows an implementation with an n-type layer overlying a layer of silicon dioxide, FIG. 3B shows an implementation with an n-type layer formed on a p-type layer, and FIG. 3C shows an implementation with an n-type layer separated from the remainder of the substrate by a p-type buried layer.

DETAILED DESCRIPTION OF THE PREFERRED EMBODIMENTS

The numerous innovative teachings of the present application will be described with particular reference to the presently preferred embodiment (by way of example, and not of limitation).

The present application describes an alternative structure, an oxide-bypassed lateral structure that can be used to fabricate lateral high voltage devices such as diodes, conventional MOSFETs, DMOSFETs, bipolar transistors, IGBTs, SCRs, and Triacs. An n-channel oxide-bypassed high voltage device uses the depletion region caused by the difference between the voltage on the conductor present at the sidewalls of the device and the voltage on the drain to prevent unwanted current flow between the drain and source of the device. An oxide-bypassed lateral high voltage structure has both its anode and its cathode on the surface of the semiconductor substrate. In an oxide-bypassed high voltage lateral DMOS transistor or "OBLDMOS" transistor, the gates that create the depletion regions that prevents unwanted current flow when the device is "off" is formed in a series of trenches that extend from the source region towards the drain region.

Figure 1:
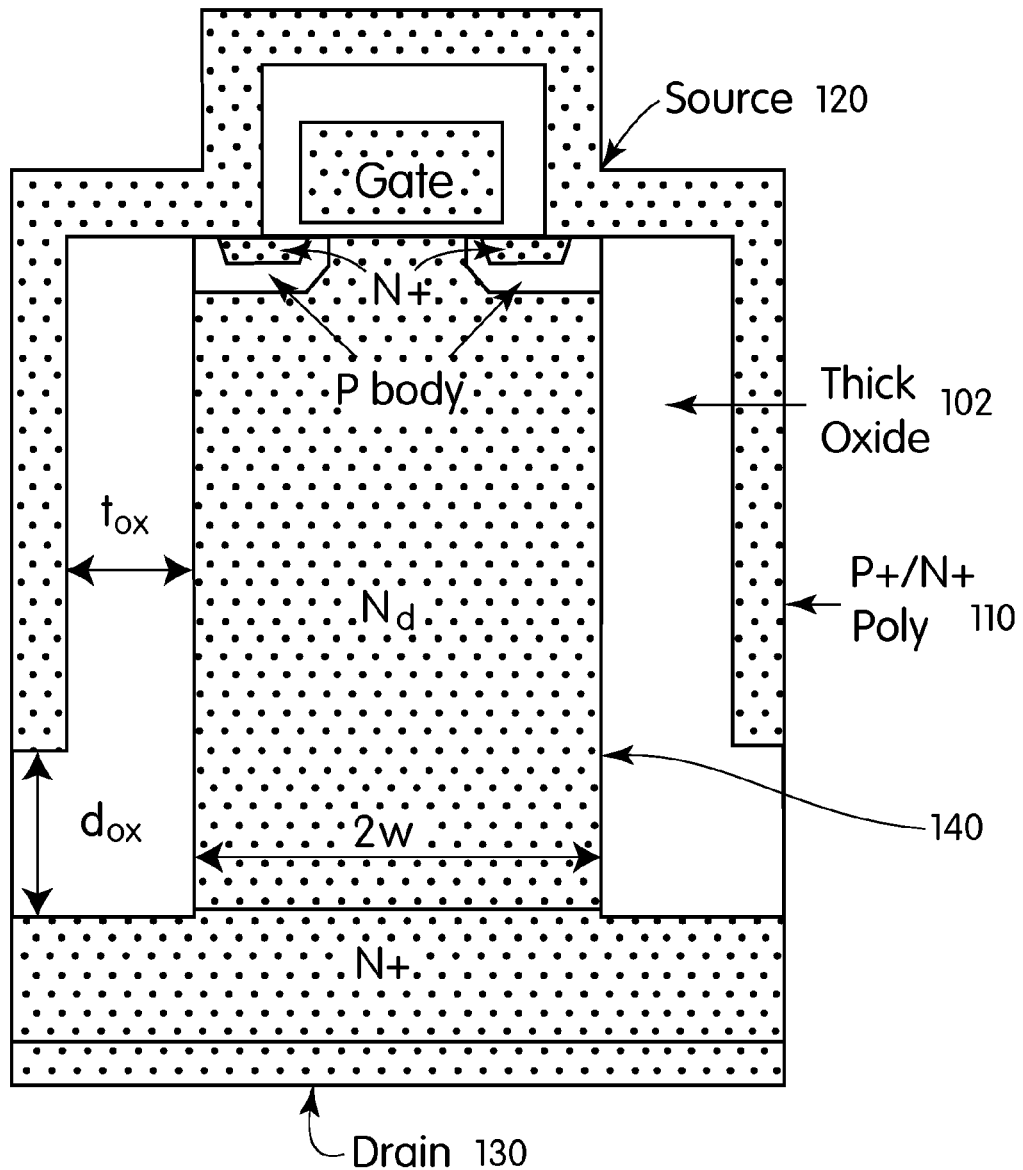
FIG. 1 shows a conventional device.
Figure 2A:
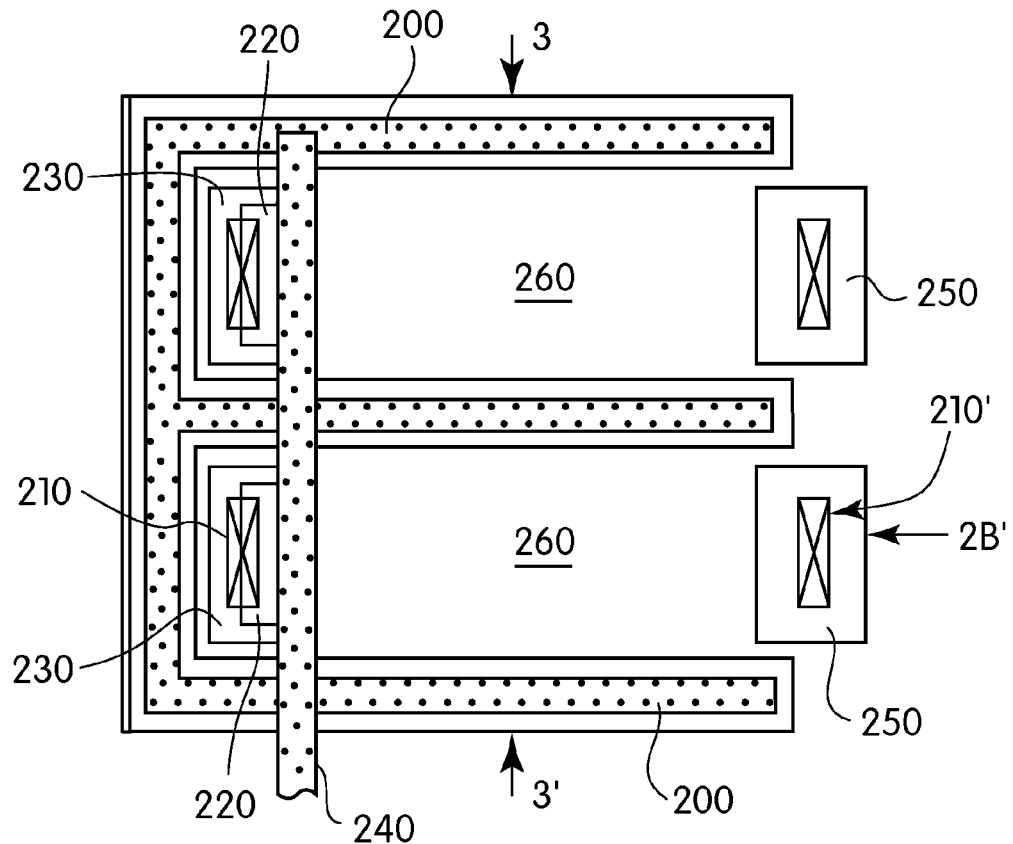
FIGS. 2A and 2B show top and side views of a sample embodiment of a high voltage oxide-bypassed lateral transistor structure.

A top view of a double-channel DMOSFET with three gates 200 that create the depletion region in the voltage-withstand region 260 is shown in FIG. 2A. The source 220 and body region 230 are on the left, with the drain 250 on the right. Gate 240 controls inversion of the channel 232 (seen in FIG. 2B), to thereby control electron injection from source 220 through channel 232 into voltage-withstand region 260. The structure shown is epitaxial, built on a p-type substrate 280. The structure shown includes two paralleled devices, controlled by a common gate 240, and both having a trench electrode 200 bordering opposite sides of a respective voltage withstand region 260.

Figure 2B:
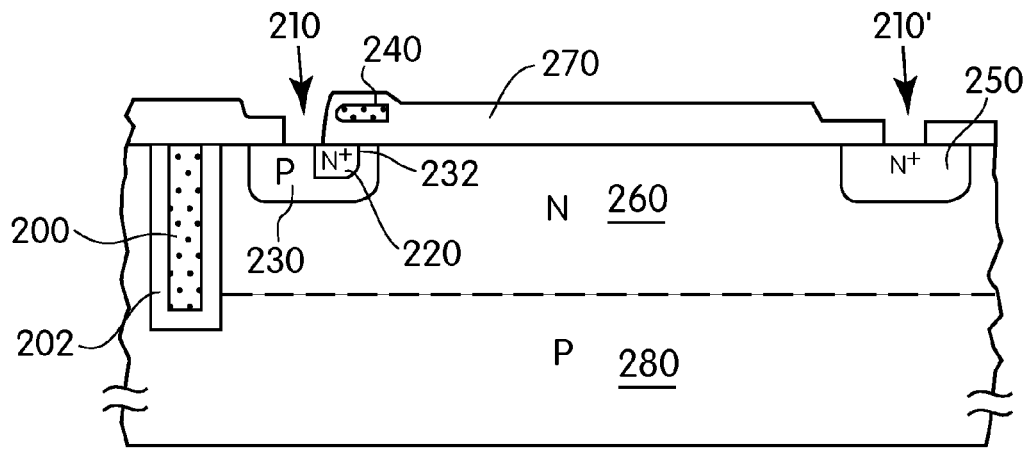

A top view is shown in FIG. 2A while a side view taken through the device at the arrows labeled 2B-2B' is shown in FIG. 2B. A contact 210, though thick oxide 270, permits contact to be made to source 220 and body 230. Similarly, another contact hole 210' permits contact to be made to the drain 250. The source 220 and body region 230 are surrounded by the trench 200 on the sides and end to prevent unwanted current flow. In this Figure the trench 200, and its insulation 202, are seen only in section, where the trench passes behind the body diffusion.

Figure 3A:
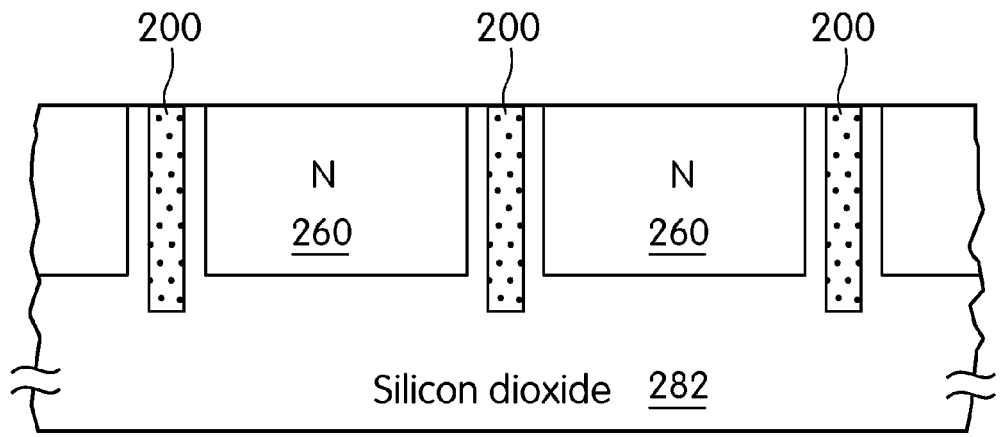
FIGS. 3A, 3B, and 3C show various possible structures for transistors of the type shown in FIGS. 2A/2B. Specifically.
Figure 3B:
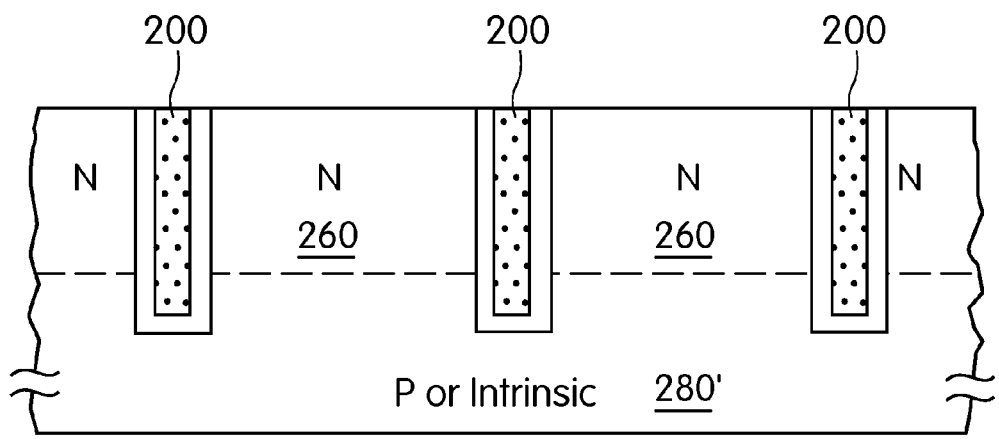
Figure 3C:
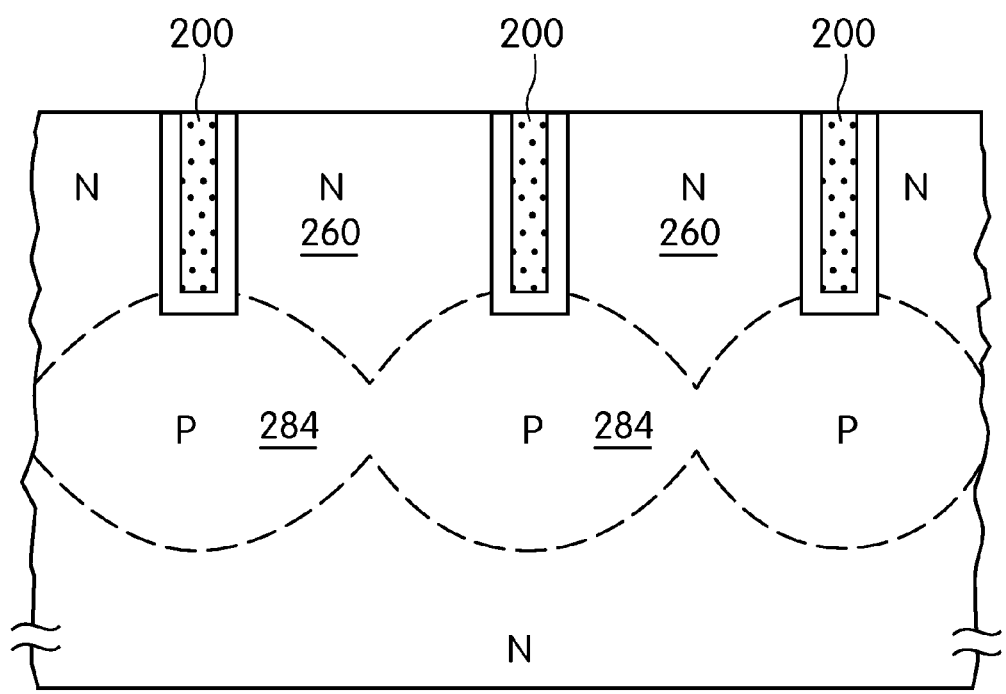

FIGS. 3A, 3B, and 3C show a few alternative structures for the device of FIG. 2A taken at the line 3-3'. FIG. 3A shows fabrication of an OBLDMOS transistor, including voltage-withstand regions 260 laterally gated by trench electrodes 200, in an n-type semiconductor layer that overlies a layer of silicon dioxide 282.

FIG. 3B shows the fabrication of an OBLDMOS transistor, including voltage-withstand regions 260 laterally gated by trench electrodes 200, in an n-type layer of semiconductor formed on a p-type or intrinsic layer 280'.

Figure 4A:
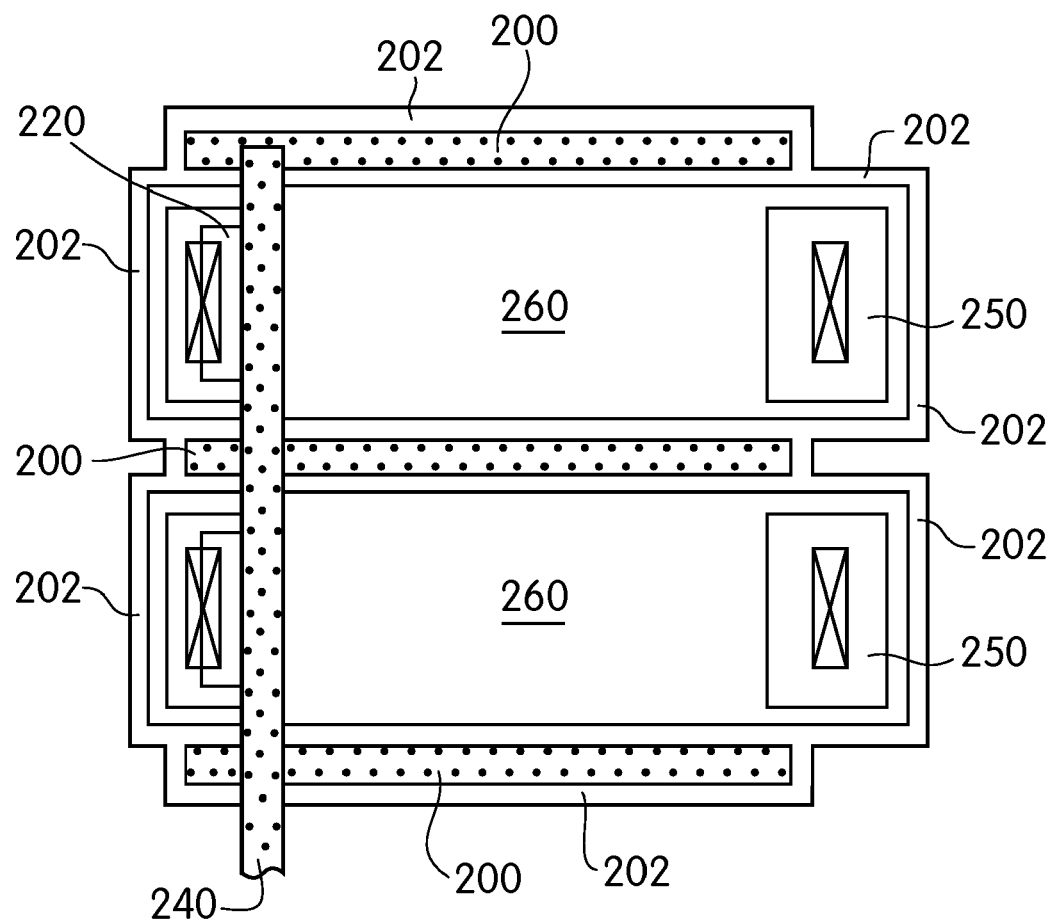
FIG. 4A shows an example of a transistor analogous to that shown in FIGS. 2A/B which is surrounded by isolation trenches.

FIG. 3C shows the fabrication of an OBLDMOS transistor, including voltage-withstand regions 260 laterally gated by trench electrodes 200, in an n-type semiconductor wafer, with a p-type buried layer 284 (outdiffused from the bottoms of the trenches 200) isolating the voltage-withstand regions 260 from the remainder of the wafer. (The trenches may even completely surround the device as shown in FIG. 4A.)

The OBLDMOS transistor shown in FIGS. 2A/B is fabricated in a wafer that is not electrically isolated from the remainder of the wafer; but alternatively this device can be isolated. FIG. 4A shows an example of a transistor which is generally analogous to that shown in FIGS. 2A/B, but which is surrounded by isolation trenches. In this example, the thick dielectric layer 202 that surrounds the trench electrode 200 continues completely around the transistor to electrically isolate it (even though the trench electrode itself is not extended beyond the borders of the voltage-withstand region 260). In this example, the separate illustrated portions of the trench electrode 200 are preferably electrically connected.

The high breakdown voltage of the structure does not require a special termination, since there is no electric field outside the device structure that is greater than the internal electric fields.

A particular advantage of this embodiment is that, if the active device is electrically isolated, it may be possible to "stack" devices electrically, to obtain higher operating voltages. (As will be understood by those of ordinary skill, the rating for the stacked combination of devices will be less than the sum of the voltage ratings of the individual devices, and external load-equalizing elements can optionally be used to avoid overvoltage on any one device.)

Figure 4B:
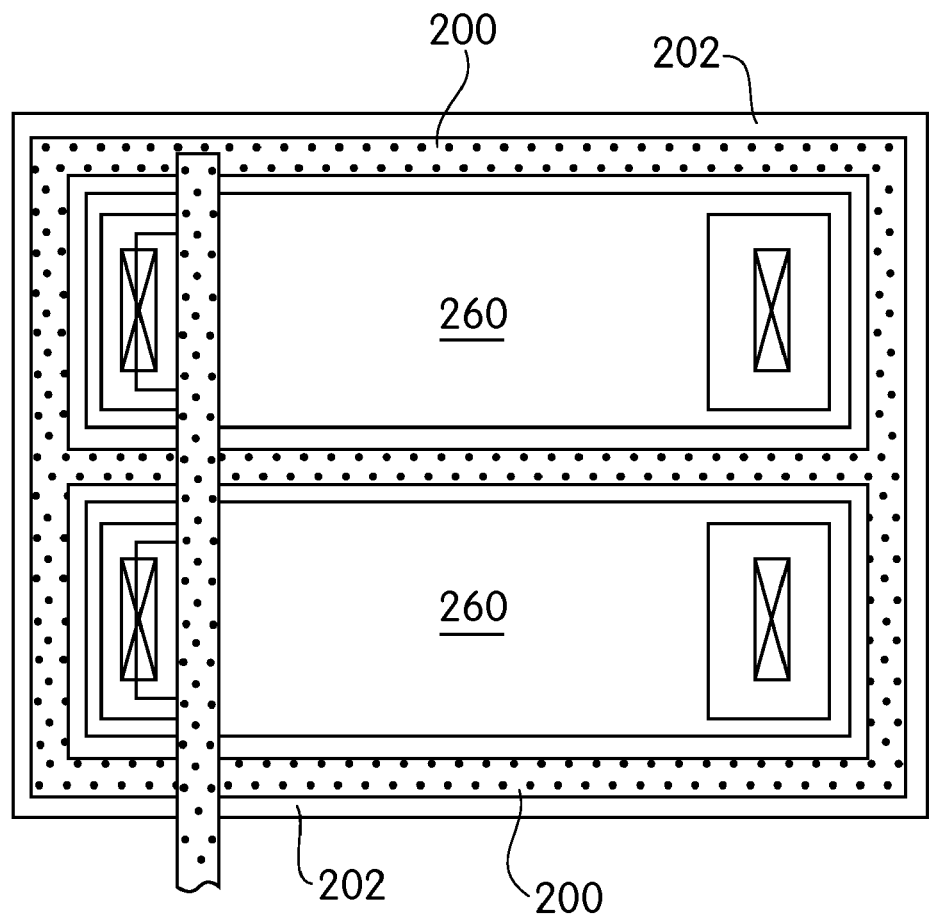
FIG. 4B shows a different way to achieve isolation.

FIG. 4B is a top view of a different isolation technique from that shown in FIG. 4A. In FIG. 4B, the trench with the field-shaping gate 200 extends to completely surround each section of the active device. This provides complete electrical isolation, not only of the device sections from each other, but also of the active devices from all other active or passive components on the chip. Note that this embodiment has (at least) similar advantages to that of FIG. 4A.

Figure 5A:
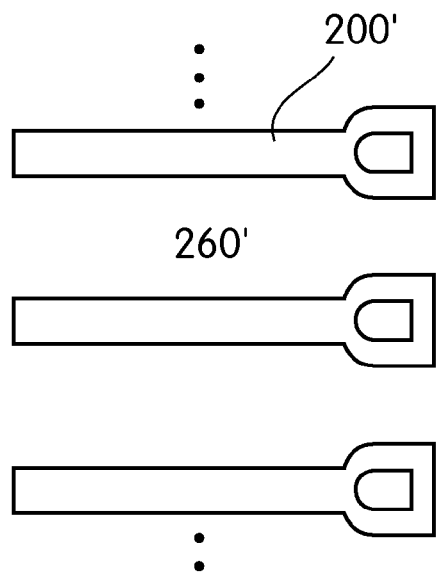
FIG. 5A shows a further class of embodiments, in which the voltage-withstand regions are made wider at the drain end to improve the device "off" characteristics.

FIG. 5A shows a further class of embodiments, in which the trench gates 200' are patterned to be wider at the drain end. Since the extra width encroaches on the voltage-withstand region, it can be seen that the resulting voltage-withstand regions 200' are therefore narrower at the drain end. This facilitates pinch-off near the drain end (where the voltage-withstand region 260' is narrowed), while preserving as much on-state conductivity as possible (since the voltage-withstand region 260' is not narrowed except near the drain end).

Figure 5B:
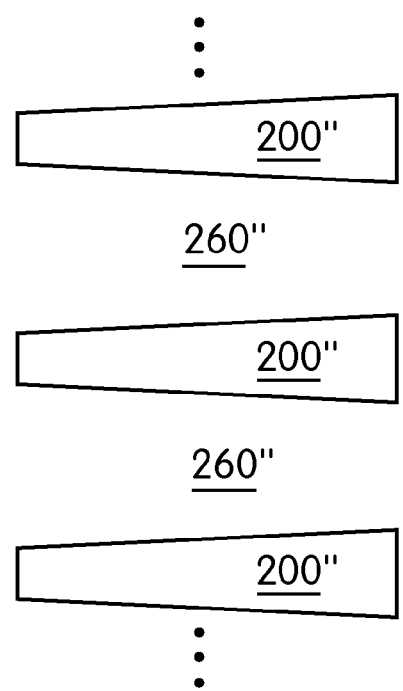
FIG. 5B shows a further class of embodiments, in which the voltage-withstand regions gradually widen from source to drain.

FIG. 5B shows a further class of embodiments, in which the trench gates 200" are patterned to gradually widen from the source end to the drain end. Since the extra width encroaches on the voltage-withstand region, it can be seen that the resulting voltage-withstand regions 260" become gradually narrower toward the drain end. This facilitates pinch-off near the drain end (where the voltage-withstand region 260' is narrowed), while preserving some on-state conductivity (since the voltage-withstand region 260" is still wide near the source end).

Figure 5C:
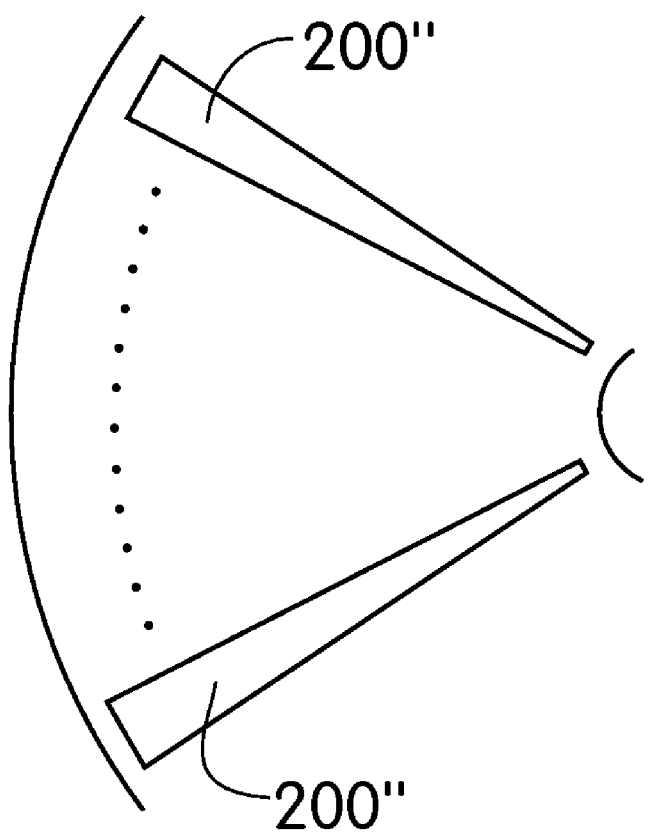
FIG. 5C shows a further class of embodiments, in which the trenches form part or all of a circle.

FIG. 5C shows a further class of embodiments, in which the tapered trenches 200" form part or all of a circle. In this embodiment the voltage-withstand regions can be e.g. constant-width regions 260 as in FIG. 2A, or tapered regions 260" as in FIG. 5B (though preferably with a slower taper than the taper of the trenches).

Figure 2C:
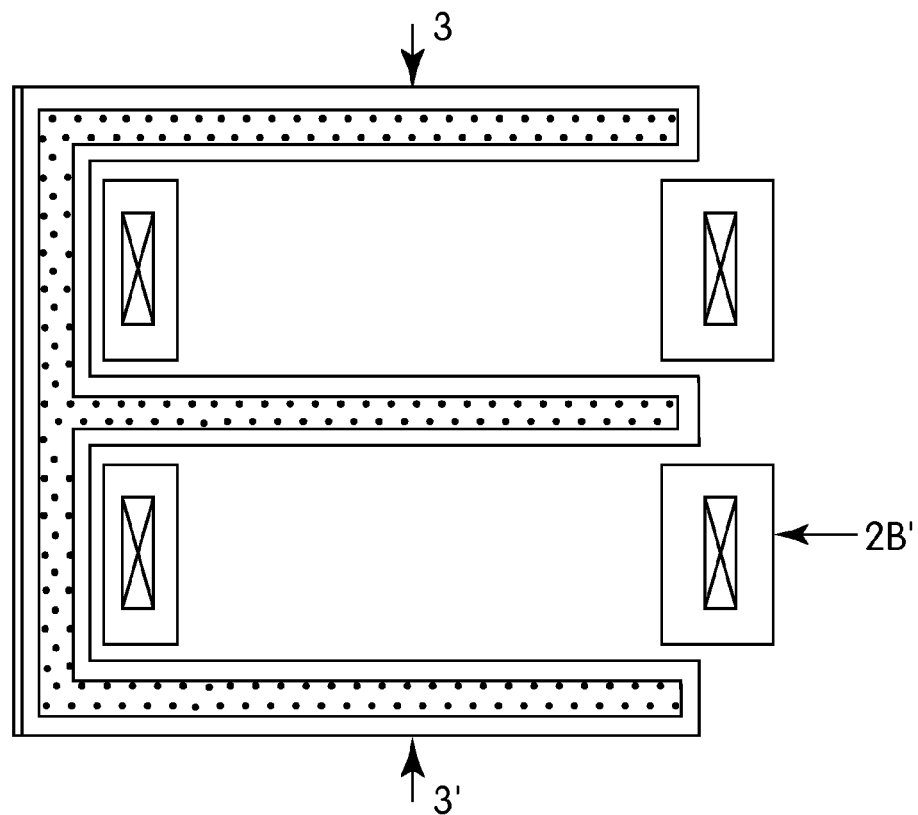
FIGS. 2C and 2D show top and side views of a sample embodiment of a high voltage oxide-bypassed lateral transistor structure.
Figure 2D:
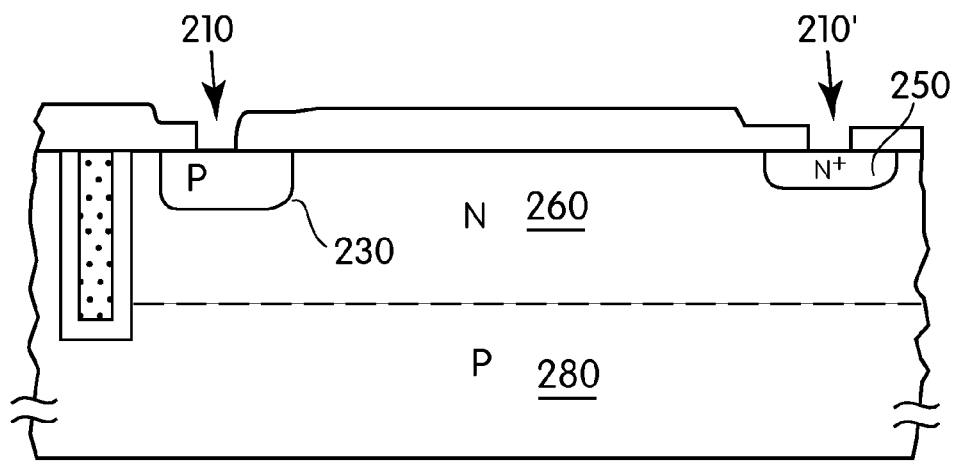

FIGS. 2C and 2D show how the embodiments of FIGS. 2A/B (and/or FIGS. 3A, 3B, 3C, 4A, 4B, 5A, 5B, and/or 5C) can be adapted to construct a high voltage diode. In this embodiment there is no source diffusion nor control gate. Instead the body diffusion 230 serves as the anode, and the diffusion 250 now serves as the cathode. The gates 200 still help to deplete the voltage-withstand region 260, as in the embodiment of FIG. 2A. Again, the structure shown includes two devices, both having a trench electrode 200 bordering opposite sides of a respective voltage withstand region 260.

Figure 6A:
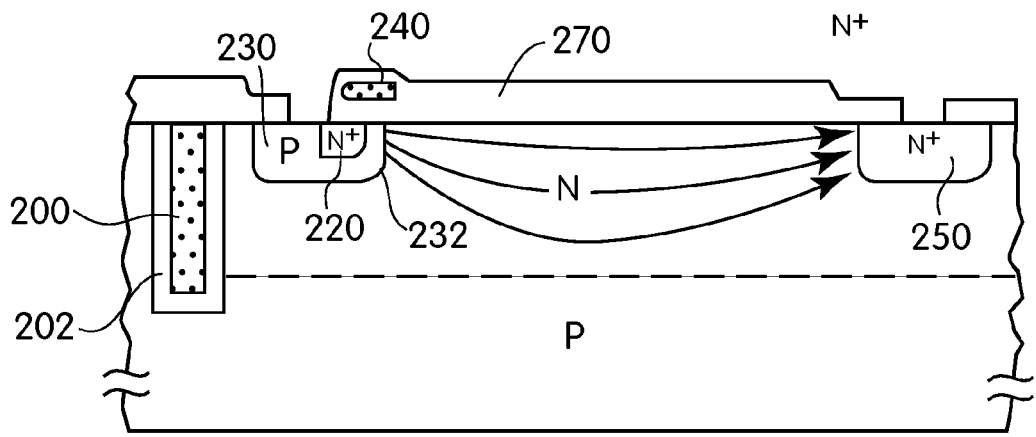
FIG. 6A shows the majority carrier flow expected in the structure of FIGS. 2A/B.

FIG. 6A shows the majority carrier flow expected in the structure of FIGS. 2A/B. Electrons flow from the source 220, through the channel 232 (when it is on), through the voltage-withstand region 260, and to the drain diffusion 250. As indicated by the schematically drawn carrier trajectories, there is some divergence of trajectories near the channel, and some convergence near the drain.

Figure 6B:
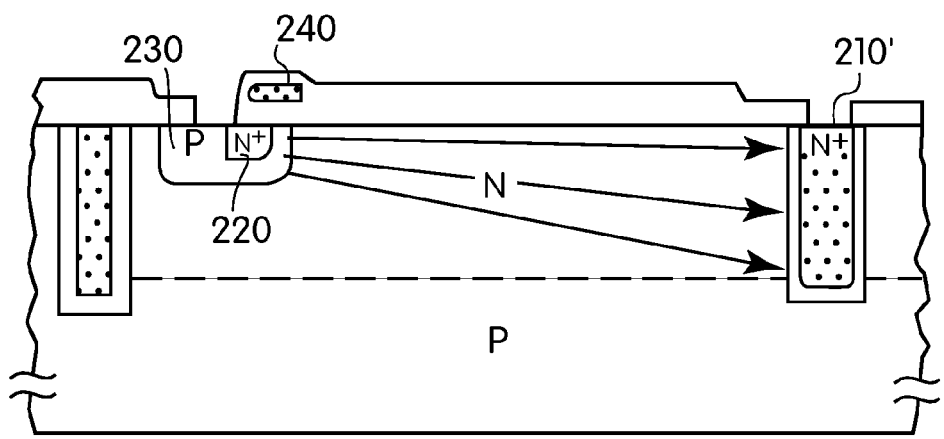
FIG. 6B shows an alternative embodiment, in which a deep n+diffusion has been added in front of the drain diffusion.

FIG. 6B shows an alternative embodiment, in which a deep n+diffusion 250' has been added in front of the drain diffusion 250. This n+diffusion 250' reduces current crowding at the drain, and thereby reduces device on-resistance. In this embodiment a trench is etched and filled with n++polysilicon; the n+dopant then outdiffuses from the polysilison to form a deep drain. As the illustrated distribution of carrier trajectories shows, current crowding at the drain side is reduced, and on-resistance is thereby also reduced. However, there is still significant carrier divergence near the source side. Since a trench etch and fill is already required for the process described above, an additional patterned portion of trench can easily be located to form this deep drain.

Figure 6C:
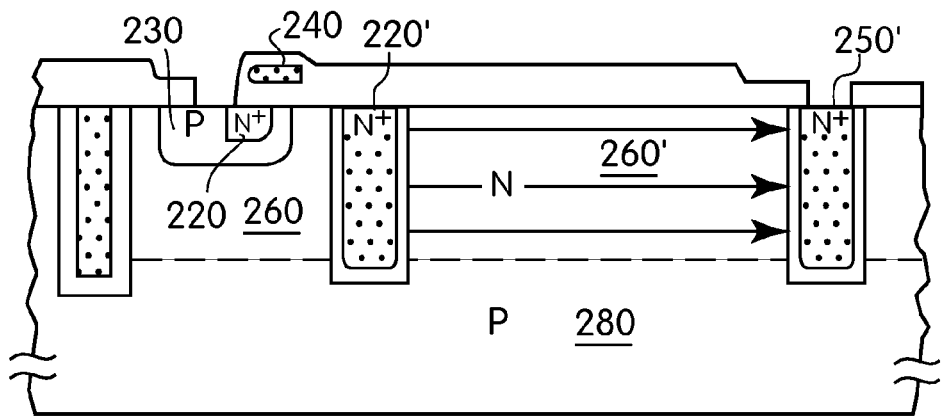
FIG. 6C shows another embodiment, in which conductive non-isolated trenches are used both on the source and drain sides of the voltage withstand region.

FIG. 6C shows a more radical embodiment, in which conductive non-isolated trenches are used both on the source and drain sides of the voltage withstand region. This embodiment not only adds a deep drain 250' to FIG. 2B, but also adds a deep virtual source 220'. The deep drain and deep virtual source work synergistically together, since each serves the equalize voltage vertically, at one respective end of the semiconductor volume which is the center of the voltage-withstand region.

As the illustrated distribution of carrier trajectories shows, current crowding is reduced at both ends of the voltage-withstand region, and on-resistance is thereby also reduced.

Figure 7:
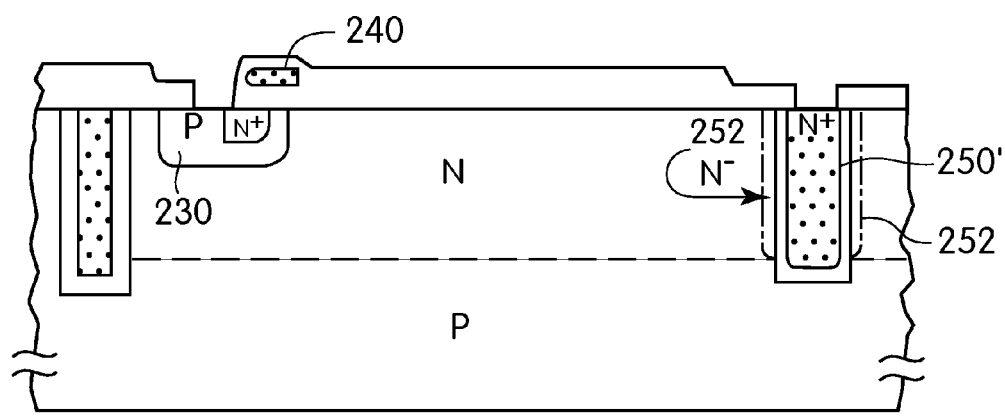
FIG. 7 shows yet another alternative embodiment, in which some counterdoping has been introduced at the face of a deep drain such as used in the embodiment of FIG. 6B or the embodiment of FIG. 6C.

FIG. 7 shows yet another alternative embodiment, in which some counterdoping has been introduced at the face of a deep drain 250' such as used in the embodiment of FIG. 6B or the embodiment of FIG. 6C. This counterdoping causes an N- region 252 to occur near the deep drain 250', and thereby helps to assure that pinchoff near the drain is still possible.

According to a disclosed class of innovative embodiments, there is provided: A lateral semiconductor device, comprising: a carrier-emission structure, which emits carriers when the device is in an ON state; and a voltage-withstand structure, through which carriers pass when the device is in the ON state, but which blocks voltage when the device is in the OFF state; wherein said voltage-withstand structure includes first and second conductive trench electrodes separated by a volume of semiconductor material, said trench electrodes each providing substantially equal potential across a respective face of said voltage-withstand structure; and wherein said carriers emitted by said carrier-emission structure pass through said first and second conductive trench electrodes.

According to a disclosed class of innovative embodiments, there is provided: a lateral semiconductor device, comprising: a carrier-emission structure; and a voltage-withstand structure, through which carriers emitted by said carrier-emission structure can pass; wherein said voltage-withstand structure includes first and second conductive trench electrodes separated by a volume of semiconductor material.

According to a disclosed class of innovative embodiments, there is provided: a lateral semiconductor device, comprising: a carrier-emission structure, which can emit charge carriers of a first type; a voltage-withstand structure, through which carriers emitted by said carrier-emission structure can pass; and a carrier-collection structure, which receives charge carriers of said first type which have passed through said voltage-withstand structure; wherein said voltage-withstand structure includes first and second conductive trench electrodes separated by a volume of semiconductor material, all connected in series between said carrier-emission and carrier-collection structures.

According to a disclosed class of innovative embodiments, there is provided: a lateral semiconductor device, comprising: a carrier-emission structure; and a voltage-withstand structure which is extended parallel to the surface of a monolithic semiconductor mass, and connected to receive carriers emitted by said carrier-emission structure; wherein said voltage-withstand structure includes first and second conductive trench electrodes separated by a volume of semiconductor material, said trench electrodes each extending into said surface; said first trench electrode being positioned to receive carriers from said carrier-emission structure, and said second trench electrode being positioned to conduct said carriers to a carrier-collection structure.

According to a disclosed class of innovative embodiments, there is provided: A lateral semiconductor device, comprising: a carrier-emission structure; a carrier-collection structure; and a voltage-withstand structure, through which carriers emitted by said carrier-emission structure can pass enroute to said carrier-collection structure, and which includes first and second conductive trench electrodes separated by and connected to a volume of semiconductor material; and wherein said volume is also laterally adjoined by third and fourth insulated trench electrodes.

According to a disclosed class of innovative embodiments, there is provided: a method of operating a lateral semiconductor device, comprising the actions of: emitting charge carriers from a carrier-emission structure into a voltage-withstand structure; while equalizing vertical potential within said voltage-withstand structure, by providing therein first and second conductive trench electrodes separated by a volume of semiconductor material; and wherein said carriers emitted by said carrier-emission structure pass through said first and second conductive trench electrodes.

According to a disclosed class of innovative embodiments, there is provided: A method of operating a lateral semiconductor device, comprising the actions of: emitting charge carriers from a carrier-emission structure into a voltage-withstand structure; and collecting said charge carriers from said voltage-withstand structure into a charge-collection structure; while equalizing vertical potential within said voltage-withstand structure, by providing therein first and second conductive trench electrodes separated by a volume of semiconductor material.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Optionally some "resurf" structure can be added to the lateral devices shown, for additional field-shaping.

For another example, the semiconductor material can be silicon, or SiC, or SiGe, or various SiGeC alloys. The disclosed structures can also be adapted to GaAs, InP, other III-V binary or pseudo-binary semiconductor materials, or to other semiconductors to the extent the processes are available.

For another example, the insulators used are not strictly limited to silicon dioxide, but can be oxynitrides or other process-compatible dielectric.

For another example, the polysilicon material which provides the gates can alternatively (but less preferably) be replaced by another conductor with good conformal deposition characteristics, e.g. tungsten.

For another example, other device types, beyond a simple FET, can optionally be constructed using the disclosed teachings.

Additional general background, which helps to show variations and implementations, may be found e.g. in the following publications, all of which are hereby incorporated by reference: Smart Power ICs (ed. Murari 2002); Benda et al., Discrete and Integrated Power Semiconductor Devices (1999); Sueker, Power Electronics Design (2005); B. J. Baliga, Silicon RF Power MOSFETs (2005); B. J. Baliga, Power Semiconductor Devices (1995); and the proceedings of the annual conferences of the International Symposium on Power Semiconductor Devices and ICs (ISPSD) from 1988 to 2005.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A lateral semiconductor device, comprising:
   a carrier-emission structure, which emits carriers when the device is in an ON state; and
   a voltage-withstand structure, through which carriers pass when the device is in the ON state, but which blocks voltage when the device is in the OFF state;
   wherein said voltage-withstand structure includes first and second conductive trench electrodes separated by a volume of semiconductor material , said trench electrodes each providing substantially equal potential across a respective face of said voltage-withstand structure;
   and wherein said carriers emitted by said carrier-emission structure pass through said first and second conductive trench electrodes.

2. The device of claim 1, wherein said voltage-withstand structure extends along a lateral direction of predominant current vector, and said trench electrodes extend both in depth and also laterally normal to said current vector.

3. The device of claim 1, wherein said carrier-emission structure includes an anode and a semiconductor diffusion abutting said anode.

4. The device of claim 1, wherein said carrier-emission structure includes a source diffusion, a semiconductor channel which abuts said source diffusion, and a gate which is capacitively coupled to said channel.

5. The device of claim 1, further comprising an electrical contact which receives carriers emitted by said carrier-emission structure, after said carriers have passed through said voltage-withstand region.

6. The device of claim 1, further comprising third and fourth trench electrodes which adjoin said semiconductor volume and are insulated from it.

7. A lateral semiconductor device, comprsing:
   a carrier-emission structure; and
   a voltage-withstand structure, though which carriers emitted by said carrier-emission structure can pass, said voltage-withstand structure includes first and second conductive trench electrodes separated by a volume of semiconductor material; and
   wherein said voltage-withstand structure extends along a lateral direction of predominant current vector, and said trench electrodes extend both in depth and also laterally normal to said current vector.

* * * * *